United States Patent [19]
Patel

[11] Patent Number: 5,317,210
[45] Date of Patent: May 31, 1994

[54] I/O CELL FOR PROGRAMMABLE LOGIC DEVICE PROVIDING LATCHED, UNLATCHED, AND FAST INPUTS

[75] Inventor: Rakesh H. Patel, Santa Clara, Calif.
[73] Assignee: Altera Corporation, San Jose, Calif.
[21] Appl. No.: 21,414
[22] Filed: Feb. 23, 1993
[51] Int. Cl.⁵ .............................. H03K 19/177
[52] U.S. Cl. ......................... 307/465; 307/243; 307/443
[58] Field of Search ............... 307/443, 465, 465.1, 307/480, 243, 272.2

[56] References Cited
U.S. PATENT DOCUMENTS

| | | | |
|---|---|---|---|
| 4,987,319 | 1/1991 | Kawana | 307/465 |
| 4,992,676 | 2/1991 | Takata et al. | 307/465 |
| 5,017,813 | 5/1991 | Galbraith et al. | 307/465 X |
| 5,023,484 | 6/1991 | Pathak et al. | 307/480 X |
| 5,245,226 | 9/1993 | Hood, Jr. et al. | 307/465.1 X |

*Primary Examiner*—David R. Hudspeth
*Attorney, Agent, or Firm*—Townsend and Townsend Khourie and Crew

[57] ABSTRACT

An input/output cell for interconnecting an I/O pad with internal circuitry in a programmable logic device provides clocked and unclocked inputs through an internal bus to selected logic array blocks. The input/output cell further includes a fast input line in which the I/O pad is directly connected with a selected logic array block without travelling through the latch circuitry of the I/O cell and the internal bus of the programmable logic device.

9 Claims, 1 Drawing Sheet

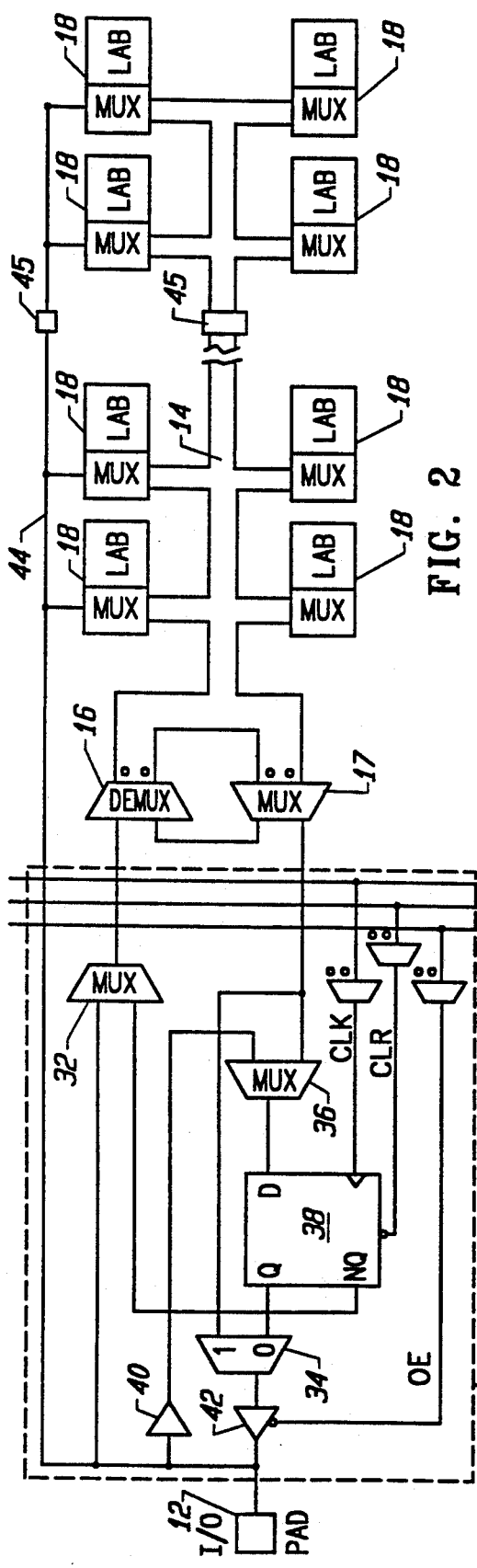
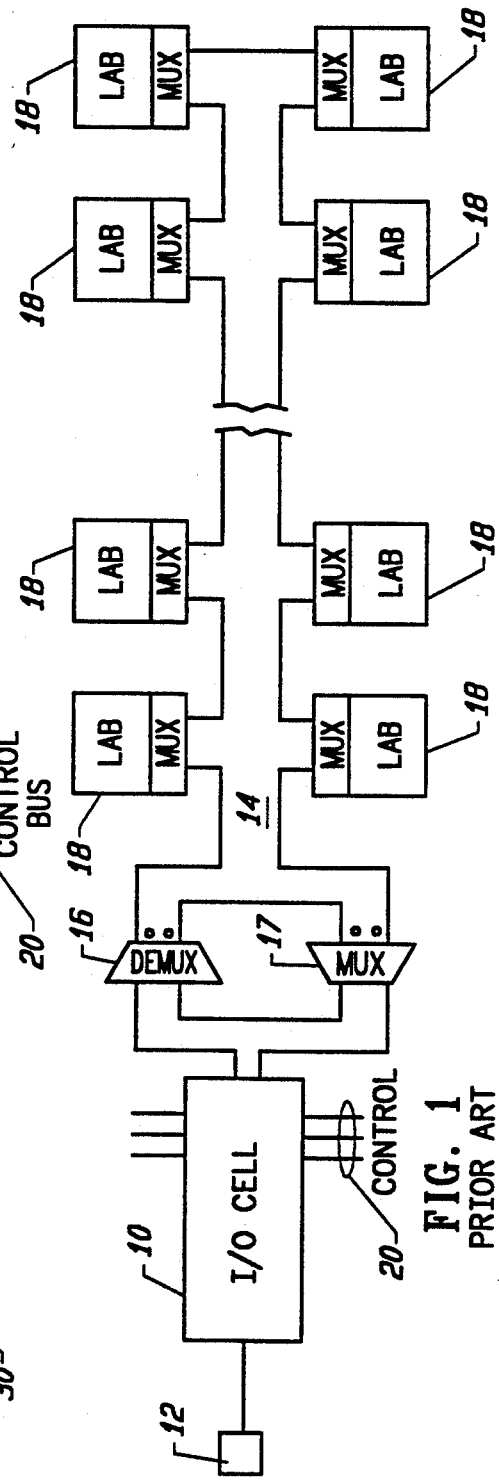
FIG. 2
FIG. 1 PRIOR ART

I/O CELL FOR PROGRAMMABLE LOGIC DEVICE PROVIDING LATCHED, UNLATCHED, AND FAST INPUTS

BACKGROUND OF THE INVENTION

This invention relates generally to programmable logic devices (PLDs), and more particularly the invention relates to a PLD having a versatile input cell providing latched, unlatched, and fast inputs.

Programmable logic devices combine the logistical advantages of standard fixed integrated circuits with the architectural flexibility of custom integrated circuits. The PLD allows engineers to electrically program standard off-the-shelf logic elements to meet specific needs of their applications. Thus, proprietary logic functions can be designed and fabricated in-house, eliminating the long engineering lead times, high tool and cost, and other problems associated with a custom application's specific integrated circuit devices, such as gate arrays and standard cells.

The PLD contains programmable AND gate arrays, fixed OR gate arrays, logic array blocks (LABs) including a plurality of macro cells and programmable registers, and programmable input/output (I/O) pins and feedback paths. Heretofore, the I/O pins have been connected through I/O cells which allow the pins to function either clocked or unclocked. The I/O cell then connects the I/O pin through a multiplexer and internal bus to a selected LAB.

The I/O cell introduces delay in the I/O function. Further, the internal bus has inherent resistance and capacitance which further introduces delay, especially in accessing LABs which are far removed from the I/O cell.

SUMMARY OF THE INVENTION

The present invention is directed to an I/O cell in a PLD with added versatility in providing inputs to logic array blocks. The I/O cell provides both clocked and unclocked inputs to the PLD and clocked and unclocked outputs to the I/O pad. Additionally, a direct connection is provided from the I/O pad to programmably selected LABs for a fast input. These selected LABs are normally at the far end of the internal bus with significant bus resistance and capacitance associated with the bus connection. The fast input has no buffering and is driven by an external source. The direct connection acts like a global line in bypassing I/O multiplexing and internal bus.

The invention and object and features thereof will be more readily apparent from the following detailed description and dependent claims when taken with the drawing.

BRIEF DESCRIPTION OF THE DRAWINGS

FIG. 1 is a functional block diagram of a conventional I/O cell and a PLD.

FIG. 2 is a functional block diagram of an I/O cell in accordance with the present invention in a PLD.

DETAILED DESCRIPTION OF ILLUSTRATED EMBODIMENT

Referring now the drawing, FIG. 1 is a functional block diagram of a conventional I/O cell 10 interconnecting an I/O pad 12 and an internal bus 14 of a PLD through an I/O demultiplexer (DEMUX) 16 and multiplexer (MUX) 17. Bus 14 has a plurality of lines which are interconnected to logic array blocks (LABs) 18. Each LAB 18 includes a multiplexer which can be programmed to respond to certain addresses on bus 14.

I/O cell 10 responds to signals on control bus 20 in providing latched and unlatched inputs and outputs between the internal bus 14 and the I/O pin 12. The clocking capability of the cell 10 along with the demultiplexer 16 and multiplexer 17 and the bus 14 introduces certain delay in signals travelling between the pad 12 and the LABs 18.

In accordance with the invention, a fast input line is included in the I/O cell to facilitate the input of data from the I/O pad 12 and LABs 18 within the PLD. As illustrated in FIG. 2, the I/O cell 30 includes a first multiplexer 32, a second multiplexer 34, and a third multiplexer 36 which are interconnected with a latch 38 for providing clocked and unclocked signals between the I/O pad 12 and the I/O demultiplexer 16 and multiplexer 17, as does the conventional I/O cell 10 of FIG. 1. Inputs from the I/O pad 12 can be passed unclocked through multiplexer 32 to the I/O demultiplexer 16 and thence through the bus 14 to addressed LABs 18. Additionally, I/O pad 12 is connected through a driver 40 to DEMUX 36 and clocked latch 38 with the clocked output of latch 38 connected through MUX 32 as a clocked input to DEMUX 16. Similarly, output signals from MUX 17 can be connected unclocked through MUX 34 and tristate driver 42 to the output pad 12, or through MUX 36 to latch 38 which provides a clocked output through MUX 34 and tristate drive 42 to the pad 12. The control bus 20 provides clock signals, clear signals and output enable signals through MUXes to the I/O cell 30. The bus includes a plurality of clock lines, a plurality of clear lines, and a plurality of enable lines which are selectively applied through the MUXes.

In addition, the I/O cell 30 includes a direct connection 44 from the I/O pad 12 to all logic array blocks 18 in the PLD through MUX inputs of the LABs. To simplify the drawing, connections are shown to the top row of LABs 18 only, but similar connections are made to the bottom row of LABs, also. Thus, any one I/O pad 12 can be connected through the I/O cell to deliver an unclocked input through bus 14, a clocked input through bus 14, or a direct input through line 44 to a selected LAB 18 in the PLD. In configuring the PLD, each I/O cell and LAB 18 will be configured as to the input path.

Rather than interconnecting the I/O pad 12 and fast input line 44 through a MUX of a LAB, a fuse link can be provided at a selected LAB 18 which is programmed for interconnecting the fast input line 44 to a selected LAB. Further, MUX or a fuse links 45 can be used to partition the fast input line 44 and BUS 14 into segments thereby reducing the resistance and capacitance if the entire line and BUS need not be used.

The I/O cell, in accordance with the invention, provides added versatility in interconnecting an I/O pad to internal logic array blocks to enhance speed when necessary and when a clocked input is not required. The invention is particularly applicable in interconnecting logic array blocks far removed from the I/O pad with the internal bus introducing significant resistance and capacitance to the input line.

While the invention has been described with reference to a specific embodiment, the description is illustrative of the invention and is not to be construed as limiting the invention. Various modifications and applications may occur to those skilled in the art without departing from the true spirit and scope of the invention as defined by dependent claims.

What is claimed is:

1. An input/output (I/O) cell for interconnecting an I/O pad with an array of logic blocks in a programmable logic device in both a clocked and unclocked mode comprising
    a first multiplexing means having an input and a plurality of outputs, said first multiplexing means selectively connecting said input through one of said outputs to an array of logic array blocks through an internal bus of said PLD,
    latch means driven by a clock and coupled to said I/O pad and to said first multiplexing means for providing a clocked output to said I/O pad and clocked inputs to said first multiplexing means, and
    interconnecting means for directly connecting said I/O pad to at least one logic block without passing through said latch means and said first multiplexing means for fast input of selected signals from an external source with said external source directly driving said at least one of logic block.

2. An input/output (I/O) cell for interconnecting an I/O pad with internal circuitry in a programmable logic device (PLD) comprising
    a first multiplexing means having an input and a plurality of outputs, said first multiplexing means selectively connecting said input through one of said outputs to an array of logic array blocks through an internal bus of said PLD,
    latch means driven by a clock and coupled to said I/O pad and to said first multiplexing means for providing a clocked output to said I/O pad and clocked inputs to said first multiplexing means,
    a second multiplexing means having a plurality of inputs and an output for selectively connecting said I/O pad and said latch means to said input of said first multiplexing means,
    third multiplexing means having a plurality of inputs and an output for selectively connecting said I/O pad and an output of said first multiplexing means to said latch means,
    fourth multiplexing means having a plurality of inputs and an output for selectively connecting said latch means and said first multiplexing means to said I/O pad, and
    means for directly connecting said I/O pad to selected logic array blocks without passing through said latch means and said first multiplexing means.

3. The input/output cell as defined in claim 2 and further including a first buffer for connecting said I/O pad to said third multiplexing means and a second buffer connecting said fourth multiplexing means to said I/O pad.

4. The input/output cell as defined by claim 3 wherein said second buffer comprises a tristate device.

5. The input/output cell as defined by claim 4 wherein said means for directly connecting said I/O pad to selected logic array blocks is driven by an external source.

6. The I/O cell as defined by claim 5 wherein said logic array block includes a multiplexer connected to said fast input line.

7. The I/O cell as defined by claim 2 wherein said means for directly connecting said I/O pad to selected logic array blocks is driven by an external source.

8. An input/output (I/O) cell for interconnecting an I/O pad with internal circuitry in a programmable logic device (PLD) comprising
    a first multiplexing means having an input and a plurality of outputs, said first multiplexing means selectively connecting said input through one of said outputs to an array of logic array blocks through an internal bus of said PLD,
    latch means driven by a clock and coupled to said I/O pad and to said first multiplexing means for providing a clocked output to said I/O pad and clocked inputs to said first multiplexing means, and
    means for directly connecting said I/O pad to selected logic array blocks without passing through said latch means and said first multiplexing means including at least one fuse link for partitioning said means for directly connecting said I/O pad into segments thereby reducing resistance and capacitance if all segments are not used.

9. The input/output cell as defined by claim 8 wherein said array of logic array blocks are interconnected through a bus to said I/O cell, said bus including fuse links for partitioning said bus into segments if all of the bus is not used.

* * * * *